United States Patent [19]
Hayashida et al.

[11] Patent Number: 5,903,029
[45] Date of Patent: May 11, 1999

[54] INSULATED-GATE FIELD-EFFECT TRANSISTOR AND METHOD FOR PRODUCING THE SAME

[75] Inventors: Shigeki Hayashida, Sendai; Seizo Kakimoto, Shiki-gun, both of Japan

[73] Assignee: Sharp Kabushiki Kaisha, Osaka, Japan

[21] Appl. No.: 08/902,673

[22] Filed: Jul. 30, 1997

[30] Foreign Application Priority Data

Jul. 31, 1996 [JP] Japan .................................. 8-201449

[51] Int. Cl.⁶ .......................... H01L 29/76; H01L 29/94; H01L 31/062; H01L 31/113
[52] U.S. Cl. .......................... 257/344; 257/345; 257/346; 257/408
[58] Field of Search .................................. 257/344, 345, 257/346, 408, 336, 337, 338

[56] References Cited

U.S. PATENT DOCUMENTS

| | | | |
|---|---|---|---|
| 5,532,508 | 7/1996 | Kaneko et al. | 257/336 |
| 5,536,957 | 7/1996 | Okumura | 257/336 |
| 5,675,166 | 10/1997 | Iiderem et al. | 257/345 |

FOREIGN PATENT DOCUMENTS 5-198804  8/1993  Japan .

*Primary Examiner*—Ngân V. Ngô
*Attorney, Agent, or Firm*—Dike, Bronstein, Roberts & Cushman, LLP; David G. Conlin

[57] ABSTRACT

An insulated-gate field-effect transistor formed in a substrate of a first conductive type or in a well of the first conductive type formed in the substrate is provided. The transistor includes a channel region containing an impurity of the first conductive type; and a source-drain region containing an impurity of a second conductive type. The source-drain region further contains an impurity of the first conductive type; and a concentration of the impurity of the first conductive type contained in the source-drain region is greater than a concentration of the impurity of the first conductive type contained in the channel region but is less than a concentration of the impurity of the second conductive type contained in the source-drain region.

10 Claims, 13 Drawing Sheets

PRIOR ART

PRIOR ART

INSULATED-GATE FIELD-EFFECT TRANSISTOR AND METHOD FOR PRODUCING THE SAME

BACKGROUND OF THE INVENTION

1. Field of the Invention

The present invention relates to an insulated gate field-effect transistor. More particularly, the present invention relates to an insulated gate field-effect transistor in which a short-channel effect is suppressed.

2. Description of the Related Art

The insulated-gate field-effect transistor has been mainly used for semiconductor integrated circuits. Recently, there has been a demand for a smaller and faster insulated-gate field-effect transistor. Accordingly, the transistor device has been miniaturized. However, when the miniaturization of the transistor device is accompanied by a shortened channel length, the short-channel effect may result. That is, as the transistor device is miniaturized, the ratio of the gate depletion layer charge to the total depletion layer charge is accordingly reduced, thereby causing problems such as lowering of the threshold voltage, deterioration of the sub-threshold performance, or generation of a punchthrough.

Particularly, in an nMOS transistor, when crystal defects are generated in the impurity implanted region while forming a source-drain region (high concentration impurity region) by implanting arsenic $^{75}As^+$ as an n-type impurity into a p-type substrate at a high concentration, boron $^{11}B^+$ contained in the p-type substrate in the vicinity of the source-drain region is segregated in the crystal defects. As a result, in the vicinity of an $n^+/p$ junction of the source-drain region, the concentration of B as a p-type impurity is reduced (i.e., the B-depletion phenomenon occurs). The depletion layer at the source-drain junction becomes larger due to the B-depletion phenomenon, whereby the short-channel effect may occur more easily. A commonly-employed method to avoid this effect is to increase the B concentration in the substrate in such a manner that the high concentration region surrounds an LDD (Lightly Doped Drain) region.

Hereinafter, a method for producing a conventional nMOS transistor will be described with reference to FIGS. 9A to 9H. FIGS. 9A to 9H are cross-sectional views illustrating the method for producing the conventional nMOS transistor.

First, as illustrated in FIG. 9A, a p well 92, a device separation film 93, and a gate insulating film 94 are formed on a silicon-substrate 91. Thereafter, a gate electrode 95 is formed by depositing polycrystalline silicon and then photo-etching the deposited layer.

Next, as illustrated in FIG. 9B, a thin insulating film 96 is formed by deposition so as to entirely cover the surface of the substrate. Then, an n-type LDD region 97 is formed by ion implantation of the $^{75}As^+$ ion, for example, as an n-type impurity.

Subsequently, as illustrated in FIG. 9C, $^{11}B^+$ as a p-type impurity is implanted at a large oblique angle of about 20 to 60°. Thus, a p-type semiconductor region 98 is formed surrounding the n-type LDD region 97. The resulting p-type semiconductor region 98 has the same conductive type as that of the p well 92 (or the substrate 91) and has an increased p-type impurity concentration.

Then, as illustrated in FIG. 9D, a thick insulating film 99 is formed to be about 150 nm in thickness. Thereafter, as illustrated in FIG. 9E, a sidewall oxide film 100 is formed on each sidewall of the gate electrode 95 by anisotropic etching.

Moreover, as illustrated in FIG. 9F, the $^{75}As^+$ ion is implanted at a concentration (e.g., about $3 \times 10^{15}$ cm$^{-2}$ at an energy of about 80 keV) greater than that of the n-type impurity ($^{75}As^+$) ion implantation for forming the LDD region 97. Thus, a source-drain region 101 as an n-type impurity region is formed while the gate electrode 95 is doped to be $n^+$.

Then, as illustrated in FIG. 9G, an annealing process is performed in order to activate the LDD region 97, the source-drain region 101 and the gate electrode 95 and to restore the crystal defects. In this step, an annealing process for 10 minutes at about 850° C. in a nitrogen atmosphere, an RTA (Rapid thermal annealing) process for 20 seconds at about 1000° C., or the like, may be performed.

Then, as illustrated in FIG. 9H, a high melting point metal film is deposited by sputtering, which is then thermally processed by a 2-step RTA process, thus forming silicide portions 102a and 102b in a self-alignment manner. The insulated-gate field-effect transistor is thus produced.

According to the above-described method, the p-type semiconductor region 98 having an increased p-type impurity concentration is formed surrounding the n-type LDD region 97 by implanting an impurity of the same conductive type (i.e., p-type: this conductive type will be referred to as the "first conductive type") as that of the p well 92 (i.e., the channel region). This, however, may cause the following problems.

Since the LDD region 97 is surrounded by the p-type semiconductor region 98, in which the p-type impurity concentration is increased, the electric field near the drain region is particularly intensified, thereby lowering the hot carrier resistance.

Moreover, as the channel length is shortened, the influence of the p-type high concentration impurity in the p-type semiconductor region 98 on the high concentration impurity region in the channel region accordingly increases. Thus, a reverse short-channel effect occurs, i.e., the threshold voltage of the channel region increases.

Furthermore, boron $^{11}B^+$, which is implanted as a p-type impurity, diffuses faster than arsenic $^{75}As^+$, which is implanted as an n-type impurity for forming the source-drain region 101. Therefore, a region having a high boron concentration is formed beneath the source-drain region 101, thereby increasing the source-drain junction capacitance. This lowers the operation speed of the circuit and increases the power consumption while the driving power is lowered due to the mobility deterioration.

SUMMARY OF THE INVENTION

According to one aspect of this invention, an insulated-gate field-effect transistor formed in a substrate of a first conductive type or in a well of the first conductive type formed in the substrate is provided. The transistor includes: a channel region containing an impurity of the first conductive type; and a source-drain region containing an impurity of a second conductive type. The source-drain region further contains an impurity of the first conductive type; and a concentration of the impurity of the first conductive type contained in the source-drain region is greater than a concentration of the impurity of the first conductive type contained in the channel region but is less than a concentration of the impurity of the second conductive type contained in the source-drain region.

In one embodiment of the invention, a concentration peak of the impurity of the first conductive type exists in the source-drain region.

In another embodiment of the invention, a location of the concentration peak of the impurity of the first conductive type is in a vicinity of a location of a concentration peak of the impurity of the second conductive type in the source-drain region.

In still another embodiment of the invention, the insulated-gate field-effect transistor is an nMOS transistor, and the impurity of the first conductive type in the source-drain region is boron.

In still another embodiment of the invention, the insulated-gate field-effect transistor is an nMOS transistor, and the impurity of the first conductive type in the source-drain region is indium.

According to another aspect of this invention, an insulated-gate field-effect transistor formed in a substrate of a first conductive type or in a well of the first conductive type formed in the substrate is provided. The transistor includes: a channel region containing an impurity of the first conductive type; a source-drain region containing an impurity of a second conductive type; and an LDD region formed between the channel region and the source-drain region so as to adjoin the channel region and the source-drain region, the LDD region containing an impurity of the second conductive type whose concentration is less than a concentration of the impurity of the second conductive type contained in the source-drain region. The LDD region further contains an impurity of the first conductive type, and a concentration of the impurity of the first conductive type contained in the LDD region is greater than a concentration of the impurity of the first conductive type contained in the channel region but is less than a concentration of the impurity of the second conductive type contained in the LDD region.

In one embodiment of the invention, a concentration peak of the impurity of the first conductive type exists in the LDD region.

In another embodiment of the invention, a location of the concentration peak of the impurity of the first conductive type is in a vicinity of a location of a concentration peak of the impurity of the second conductive type in the LDD region.

In still another embodiment of the invention, the insulated-gate field-effect transistor is an nMOS transistor, and the impurity of the first conductive type in the LDD region is boron.

In still another embodiment of the invention, the insulated-gate field-effect transistor is an nMOS transistor, and the impurity of the first conductive type in the LDD region is indium.

According to still another aspect of this invention, a method for producing an insulated-gate field-effect transistor formed in a substrate of a first conductive type or in a well of the first conductive type formed in the substrate is provided. The transistor includes: a channel region containing an impurity of the first conductive type; and a source-drain region containing an impurity of a second conductive type. The method includes the steps of: forming a gate insulating film on the substrate and forming a gate electrode on the gate insulating film; forming an insulating film on the substrate, on which the gate electrode has been formed; forming a sidewall insulating film on a sidewall of the gate electrode by anisotropically etching the insulating film; ion-implanting the impurity of the first conductive type into a region to be the source-drain region; forming the source-drain region by ion-implanting the impurity of the second conductive type into the region to be the source-drain region; performing an annealing process so as to activate the impurities of the first and second conductive types and to restore crystal defects generated by the ion implantations. The ion implantation step and the source-drain region formation step are performed so that a concentration of the impurity of the first conductive type contained in the source-drain region is greater than a concentration of the impurity of the first conductive type contained in the channel region but is less than a concentration of the impurity of the second conductive type contained in the source-drain region.

According to still another aspect of this invention, a method for producing an insulated-gate field-effect transistor formed in a substrate of a first conductive type or in a well of the first conductive type formed in the substrate is provided. The transistor includes: a channel region containing an impurity of the first conductive type; a source-drain region containing an impurity of a second conductive type; and an LDD region formed between the channel region and the source-drain region so as to adjoin the channel region and the source-drain region. The method includes the steps of: forming a gate insulating film on the substrate and forming a gate electrode on the gate insulating film; forming a first insulating film on the substrate, on which the gate electrode has been formed; ion-implanting the impurity of the first conductive type using the gate electrode as a mask; forming the LDD region by ion-implanting the impurity of the second conductive type; forming a second insulating film on the gate electrode and the substrate; forming a sidewall insulating film on a sidewall of the gate electrode by anisotropically etching the second insulating film; forming the source-drain region by ion-implanting the impurity of the second conductive type into a region to be the source-drain region; performing an annealing process so as to activate the impurities of the first and second conductive types and to restore crystal defects generated by the ion implantations. The ion implantation of the impurities of the first and second conductive types is performed so that a concentration of the impurity of the second conductive type contained in the LDD region is less than a concentration of the impurity of the second conductive type contained in the source-drain region while a concentration of the impurity of the first conductive type contained in the LDD region is greater than a concentration of the impurity of the first conductive type contained in the channel region, and the concentration of the impurity of the first conductive type contained in the LDD region is less than the concentration of the impurity of the second conductive type contained in the LDD region.

Thus, the invention described herein makes possible the advantages of (1) providing an insulated-gate field-effect transistor in which: even when the gate length is shortened, the hot carrier resistance is not deteriorated while the short-channel effect is suppressed; and an increase in the junction capacitance and the reverse short-channel effect can also be suppressed; and (2) providing a method for producing such a transistor.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
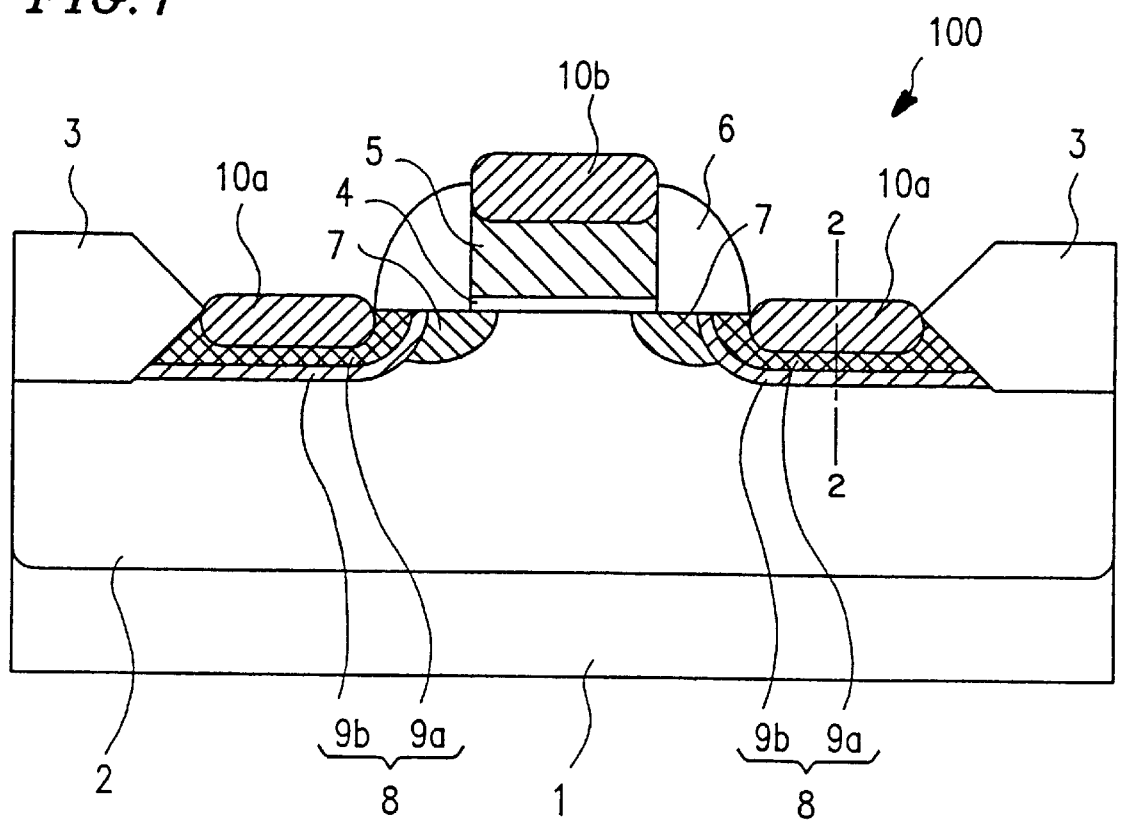
FIG. 1 is a cross-sectional view illustrating an insulated-gate field-effect transistor according to an example of the present invention.

FIG. 1 is a cross-sectional view illustrating a configuration of an n-channel insulated-gate field-effect transistor 100 according to the present invention. For discussion purpose, the first conductive type denotes the p-type while the second conductive type denotes the n-type, in the following description of the present invention.

Referring to FIG. 1, an n-channel insulated-gate field-effect transistor 100 of the present invention is formed in a p well 2 of the first conductive type, which is formed in a silicon substrate 1, and is separated from other devices by a device separation film 3. A gate insulating film 4 is formed on the p well 2. A polycrystalline silicon film 5 having a thickness of about 150 nm is formed on the gate insulating film 4. The thickness of the polycrystalline silicon film 5 is preferably about 100 to 200 nm. If the polycrystalline silicon film 5 has a thickness within such a range, depletion layer will not be formed at an interface between polycrystalline silicon 5 and gate insulating film 4 when a gate bias is applied or $^{75}As^+$ will not pass through the gate insulating film 4 when n$^+$-doping the polycrystalline silicon film 5 by implanting $^{75}As^+$ as an impurity of the second conductive type.

Moreover, a gate electrode sidewall film 6 is formed on each of the sidewalls of the polycrystalline silicon film 5. An LDD region 7 is formed beneath the gate electrode sidewall film 6. The thickness of the gate electrode sidewall film 6 is set to be about 50 to 200 nm in order to assure a sufficient LDD region 7. The LDD region 7 is formed by ion implantation.

Furthermore, a source-drain region 8 is formed on each side of the polycrystalline silicon film 5. As illustrated in FIG. 1, the source-drain region 8 includes a region 9a having a high boron concentration (hereinafter, referred to as the "high concentration region 9a"). The impurity to be implanted into the high concentration region 9a is not limited to boron, but an impurity different from that of the source-drain region, such as indium (In), having the same conductive type (the first conductive type: p-type) as that of boron may also be used. Since In, as compared to boron, has a larger atomic weight, a smaller implantation range and a smaller diffusion coefficient, the extent of the impurity distribution of the impurity implantation will be small, whereby it is easy to control the impurity concentration profile.

A source-drain electrode 10a is provided on each of the source-drain regions 8. Each of the source-drain electrodes 10a is a silicide film formed in a self-alignment manner. Similarly, a gate electrode 10b is provided on the polycrystalline silicon film 5. The gate electrode 10b is a silicide film formed in a self-alignment manner.

Figure 2:
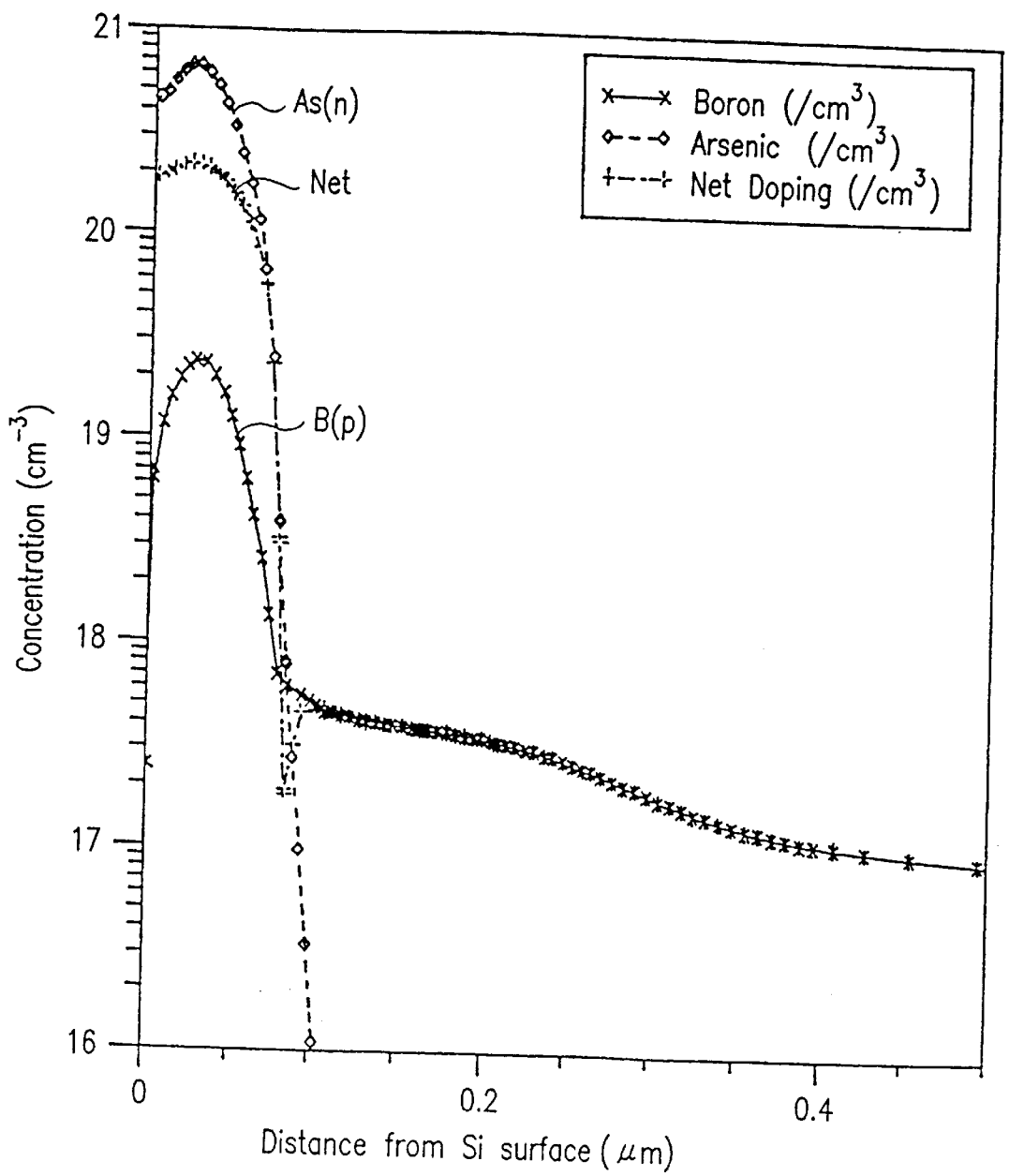
FIG. 2 is a graph illustrating a concentration distribution of an impurity existing in a source-drain region of the insulated-gate field-effect transistor according to an example of the present invention.

FIG. 2 illustrates the respective concentration profiles of boron, arsenic, and the net doping in the channel region and the source-drain regions 8 along the cross section A-A' of the n-channel insulated-gate field-effect transistor 100 illustrated in FIG. 1.

As can be seen from FIG. 2, the peak location of the boron concentration distribution in the source-drain region 8 is at a distance of about 50 nm from the silicon substrate surface, with the boron concentration at the peak location being about $2\times10^{19}$ cm$^{-3}$. The peak location of the boron concentration is in the vicinity of the nuclei of the crystal defects generated by the ion implantation for forming the source-drain region. Preferably, the boron concentration at the peak location is made as great as possible within a range such that it is equal to or less than the arsenic concentration in the source-drain region and that the charge-carrying electron concentration of the source-drain region and the impurity concentration of the channel and the substrate will not be changed considerably.

Furthermore, as can be seen from FIG. 2, the arsenic concentration at the peak is about $7\times10^{20}$ cm$^{-3}$, with the junction depth being about 100 nm from the silicon substrate surface The boron concentration in the p well 2 is about $1\times10^{17}$ cm$^{-3}$.

Figure 3:
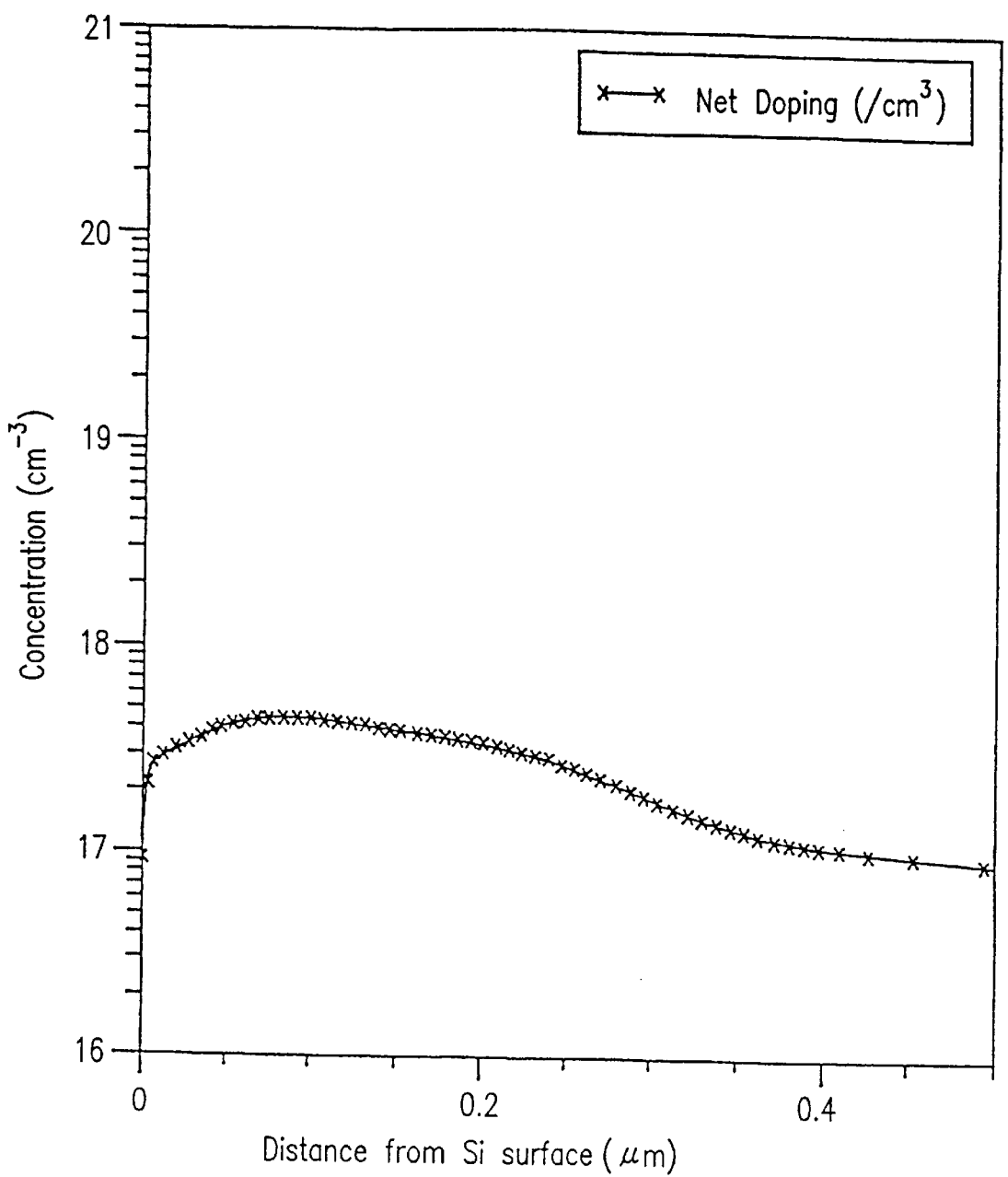
FIG. 3 is a graph for comparison illustrating a concentration distribution only of an impurity existing in the channel region of the insulated-gate field-effect transistor of the present invention.

FIG. 3 is a concentration profile only in the channel region provided for illustrating the influence of the impurity implantation of the present example on the impurity concentration in the region and the substrate. As can be seen from FIG. 3, at a distance of about 100 nm or more from the silicon substrate surface, the net doping concentration in the channel region is approximately the same as that shown in the concentration profile of FIG. 2. This comparison indicates that, in the insulated-gate field-effect transistor 100 of the present example, the impurity implantation is performed in such a manner that the boron concentration has its peak in the source-drain region without considerably changing the impurity concentration in the substrate and channel regions excluding the source-drain region.

Due to such a boron concentration distribution in the source-drain region, during the annealing process, the impurity in the channel region does not diffuse in an accelerative manner into the source-drain region since the boron in the source-drain region fills the crystal defects. Thus, the B-depletion phenomenon can be suppressed. Therefore, it is possible to prevent the boron concentration in the vicinity of the n$^+$/p junction in a substrate region from being reduced by the B-depletion phenomenon and to suppress the short-channel effect. Moreover, since there exists no semiconductor region surrounding the LDD region 7 with a high concentration of the impurity of the first conductive type (p-type), as in the prior art, the hot carrier resistance is not deteriorated. Furthermore, since the concentration distribution of the impurity of the first conductive type (i.e., the conductive type opposite to that of the source-drain region) has its peak in the source-drain region 8 (high concentration region 9a), there is little influence on the concentration of the impurity existing beneath the source-drain region. Thus, the reverse short-channel effect can be suppressed while the source-drain junction capacitance can be prevented from increasing.

Although an n-channel MOS transistor is used in the present example, a p-channel MOS transistor may also be used. In such a case, the conductive type of every ion to be implanted is reversed from that of the present example.

EXAMPLE 2

Figure 4:
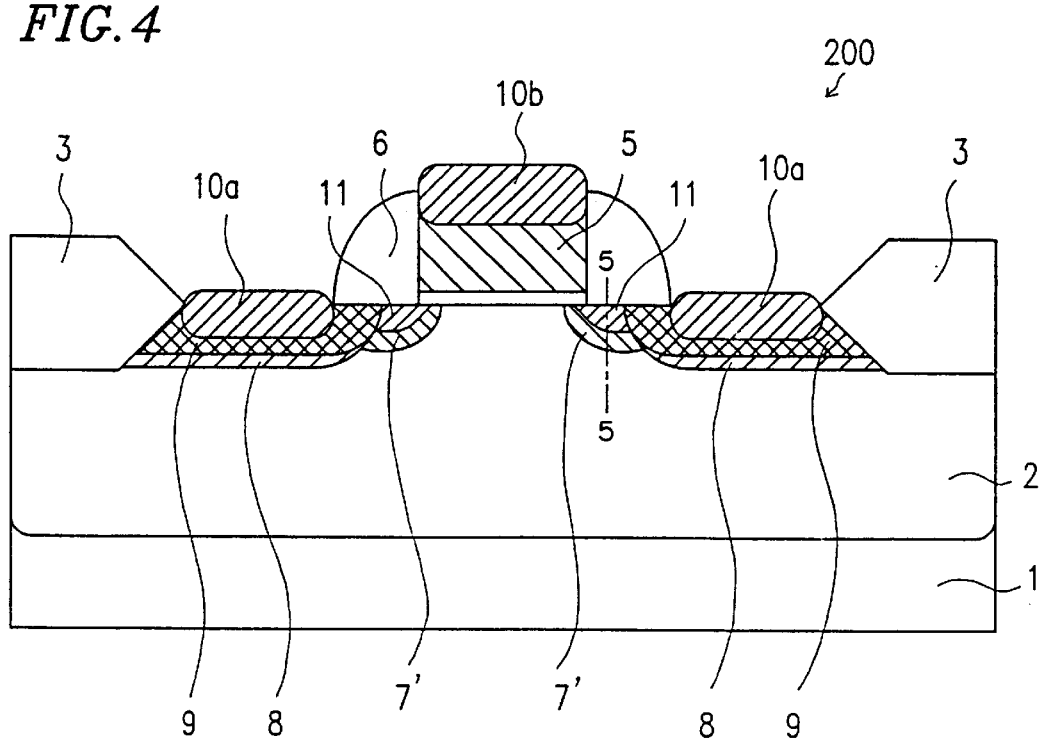
FIG. 4 is a cross-sectional view illustrating an insulated-gate field effect transistor according to another example of the present invention.

FIG. 4 illustrates a configuration of an n-channel insulated-gate field-effect transistor 200 according to Example 2 of the present invention, in which elements that are also present in the n-channel insulated-gate field-effect transistor 100 (see FIG. 1) of Example 1 are denoted by the same reference numerals as in the transistor 100.

In n-channel insulated-gate field-effect transistor 200 of the present example, an LDD region 7' includes a boron high concentration region 11 (hereinafter, referred to as the "high concentration region 11"). The peak of the boron concentration exists in the high concentration region 11.

As in Example 1, the impurity to be implanted to form the high concentration region 11 is not limited to boron, but a different impurity having the same conductive type (the first conductive type: p-type) as that of boron, such as indium (In) may also be used. By providing the high concentration region 11 in the LDD region 7', as in the present example, the performance of the insulated-gate field-effect transistor 200 can be improved.

Figure 5:
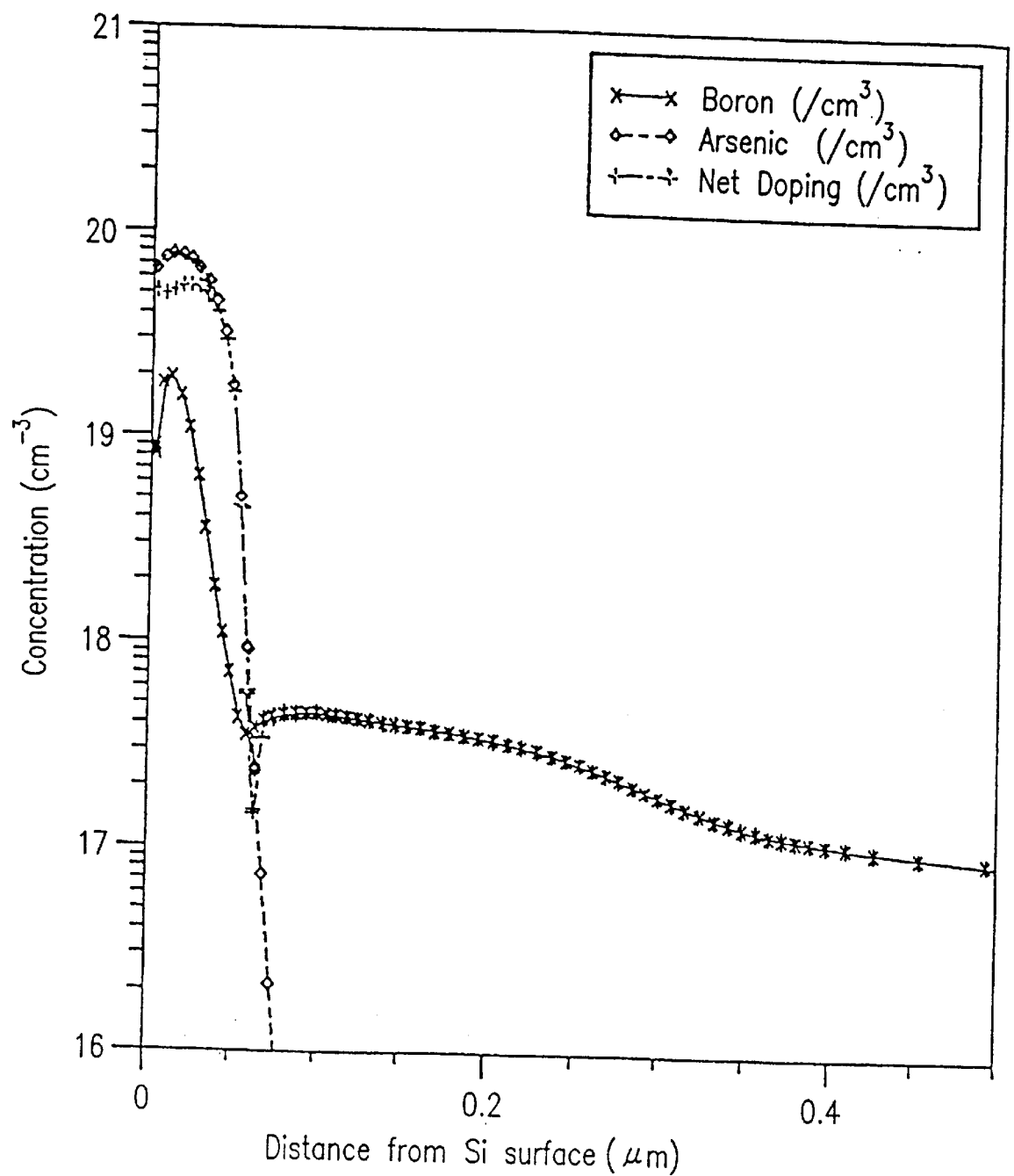
FIG. 5 is a graph illustrating a concentration distribution of an impurity existing in an LDD region of the insulated-gate field-effect transistor according to another example of the present invention.

FIG. 5 illustrates the respective concentration profiles of boron, arsenic, and the net doping in the LDD region 7' along the cross section B-B' of the n-channel insulated-gate field-effect transistor 200 illustrated in FIG. 4.

As can be seen from FIG. 5, the peak location of the boron concentration distribution in the LDD region 7' is at a distance of about 25 nm from the silicon substrate surface, with the boron concentration at the peak location being about $2\times10^{19}$ cm$^{-3}$. The peak location of the boron concentration is in the vicinity of the nuclei of the crystal defects generated by the ion implantation for forming the LDD region 7'. Preferably, the boron concentration at the peak location is made as great as possible within a range such that it is equal to or less than the arsenic concentration in the LDD region 7' and that the charge-carrying electron concentration of the LDD region 7' and the impurity concentration of the channel and the substrate will not be changed considerably.

Moreover, in the LDD region 7', the arsenic concentration at the peak thereof is about $8\times10^{19}$ cm$^{-3}$, with the junction depth being about 70 nm. The boron concentration in the p well is about $1\times10^{17}$ cm$^{-3}$. The junction depth of the LDD region 7' is set to be less than that of the source-drain region 8 while the boron concentration in the LDD region 7' is set to a level such that the driving power for driving the transistor is assured.

In the insulated-gate field-effect transistor 200 of the present example, the impurity implantation is performed in such a manner that the boron concentration has its peak in the LDD region 7' without considerably changing the impurity concentration in the substrate and channel regions excluding the LDD region 7'.

Due to such a boron concentration distribution in the LDD region 7', during the annealing process, the impurity in the channel region does not diffuse in an accelerative manner into the LDD region 7' and the source-drain region since the boron in the LDD region 7' fills the crystal defects. Thus, the B-depletion phenomenon can be suppressed. Therefore, it is possible to prevent the boron concentration in the vicinity of the n$^+$/p junction in the substrate region from being reduced by the B-depletion phenomenon and to suppress the short-channel effect. Moreover, since there exists no semiconductor region surrounding the LDD region 7' with a high concentration of the impurity of the first conductive type (p-type), as in the prior art, the hot carrier resistance is not deteriorated. Furthermore, since the concentration distribution of the impurity (boron) of the first conductive type (i.e., the conductive type opposite to that of the source-drain region) has its peak in the LDD region 7', there is little influence on the concentration of the impurity existing beneath the source-drain region. Thus, the reverse short-channel effect can be suppressed while the source-drain junction capacitance can be prevented from increasing.

Generally, the LDD region needs to be formed near the silicon substrate surface, i.e., it needs to be formed to be shallow. When crystal defects are generated due to the implantation of the n-type impurity $^{75}$As$^+$ for forming the LDD region, boron is likely to be drawn to and segregated in the crystal defects during an annealing process. Thus, the crystal defects resulting from the LDD region formation process have a great influence particularly on the boron concentration of the channel region and the substrate. Accordingly, by providing the high concentration region of boron (or an impurity having the same conductive type as that of boron) in the LDD region of the insulated-gate field-effect transistor 200 of the present example, a greater effect can be realized.

EXAMPLE 3

In this example, a method for producing the n-channel insulated-gate field-effect transistor 100, as described in Example 1, will be described with reference to FIGS. 6A to 6H.

Figure 6A:
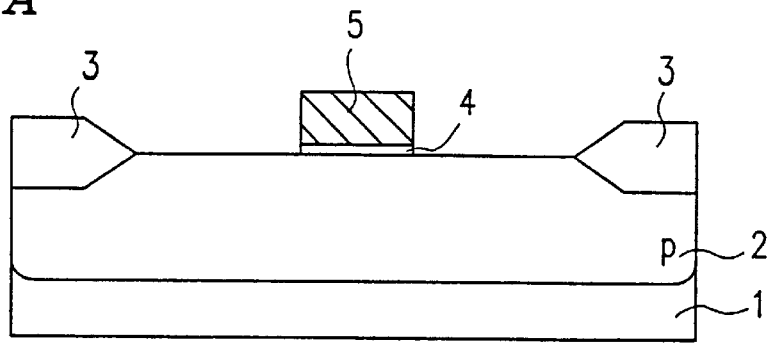
FIGS. 6A to 6H are cross-sectional views illustrating production steps for producing an insulated-gate field-effect transistor according to an example of the present invention.

First, as illustrated in FIG. 6A, the p well 2 of the first conductive type, a field oxide film 3 as a device separation film, and the gate insulating film 4 are formed on the silicon substrate 1 by a known method. Other than the ordinary silicon oxide film, a nitrogen oxide film (i.e., N$_2$O) having a low nitrogen concentration may also be used for the gate insulating film 4. Thereafter, the polycrystalline silicon film 5 is formed by depositing a polycrystalline silicon on the gate insulating film 4 using a commonly-employed method, and then processing the resulting layer by photolithography and dry-etching.

Figure 6B:
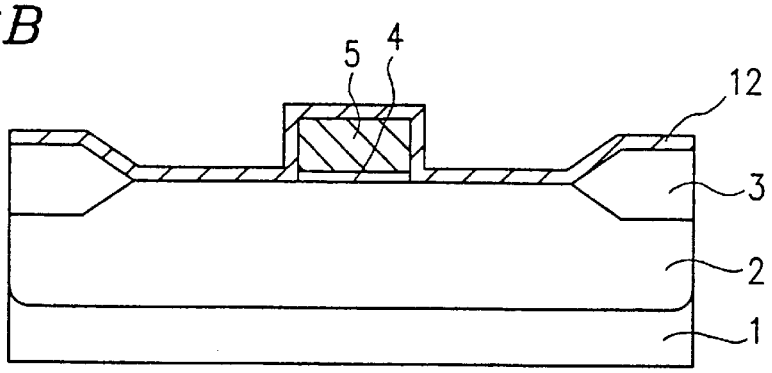

Then, as illustrated in FIG. 6B, a silicon nitride film 12 is formed by deposition to be about 5 to 20 nm in thickness. The silicon nitride film 12 may be a different type of insulating film if the metal silicide portion is not to be formed in a self-alignment manner in a step to be described later.

Figure 6C:
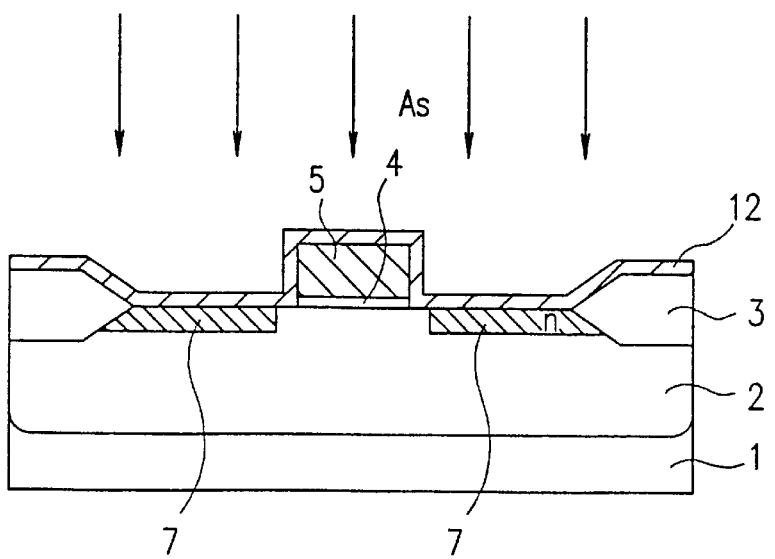

Next, as illustrated in FIG. 6C, arsenic $^{75}$As$^+$ as an impurity of the second conductive type is ion-implanted so as to form the LDD region 7. $^{75}$As$^+$ is implanted at, for example, about $1\times10^{14}$ to $5\times10^{14}$ cm$^{-2}$ at an energy of about 20 to 30 keV. Other than the arsenic ion, $^{31}$p$^+$ may also be an impurity of the second conductive type (n-type) to be used for forming the LDD region 7. However, it is preferable to use $^{75}$As$^+$ in view of forming the junction of the LDD region 7 to be shallow, i.e., near the silicon substrate surface, (in order to suppress the short-channel effect), and reducing the parasitic resistance. Moreover, the conditions for the ion implantation for the LDD region 7 must be set so that the LDD region 7 is formed to be shallower than the source-drain region, which is to be formed in a subsequent step.

Figure 6D:
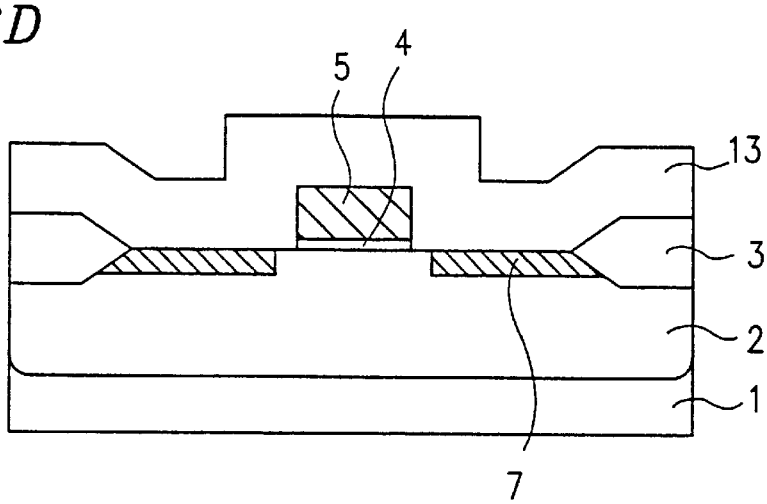

Then, a relatively thick oxide film 13 is formed by deposition to be about 70 to 250 nm in thickness (see FIG. 6D). The relatively thick oxide film 13 is used for forming the gate electrode sidewall film 6.

Figure 6E:
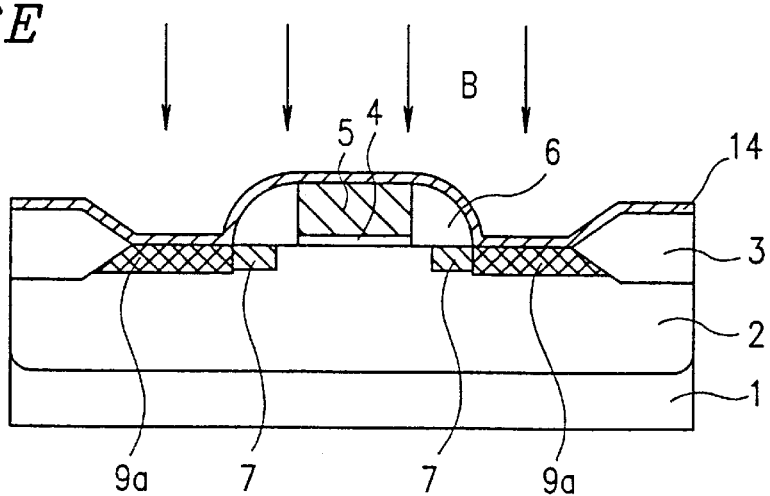

Next, the oxide film 13 is etched back by anisotropic etching so as to form the gate electrode sidewall film 6 on each of the sidewalls of the polycrystalline silicon film 5. Subsequently, a silicon nitride film 14 is formed by deposition on the entire substrate to be about 5 to 20 nm in thickness. The silicon nitride film 14 may also be a different type of insulating film if the metal silicide portion is not to be formed in a self-alignment manner in a step to be described later. Thereafter, as illustrated in FIG. 6E, boron $^{11}$B$^+$ as an impurity of the first conductive type (p-type) is ion-implanted via the silicon nitride film 14 so as to form a boron high concentration region 9a (hereinafter, referred to as the "high concentration region 9a"). $^{11}$B$^+$ is implanted at, for example, about $3 \times 10^{12}$ to $1 \times 10^{14}$ cm$^{-2}$ at an energy of about 5 to 15 keV.

Other than the boron ion $^{11}$B$^+$, a different impurity having the same conductive type (p-type) as that of $^{11}$B$^+$ may also be an impurity of the first conductive type (p-type) to be used for forming the high concentration region 9a. For example, $^{49}$BF$_2{}^+$ may be implanted at an energy of about 15 to 65 keV, or $^{115}$In$^+$ may be implanted at an energy of about 30 to 90 keV.

Moreover, it is necessary to properly set the conditions for the ion implantation for the high concentration region 9a so that the peak location of the impurity concentration (boron concentration) in the high concentration region 9a is in a region shallower than the source-drain region 8 (9b) to be formed in a subsequent step, and that the impurity concentration in the high concentration region 9a is greater than that in the substrate and channel regions excluding the source-drain region 8. Moreover, it is necessary to set the conditions for the ion implantation such that there will be little change in the impurity (boron) concentration in the channel region excluding the source-drain region 8.

Furthermore, the peak of the boron concentration distribution is in the vicinity of the nuclei of the crystal defects generated by the ion implantation for forming the source-drain region 8. Preferably, the boron concentration at the peak location is made as great as possible within a range such that it is equal to or less than the arsenic concentration in the source-drain region 8 and that the charge-carrying electron concentration of the source-drain region 8 and the impurity concentration of the channel and the substrate will not be changed considerably.

Figure 6F:
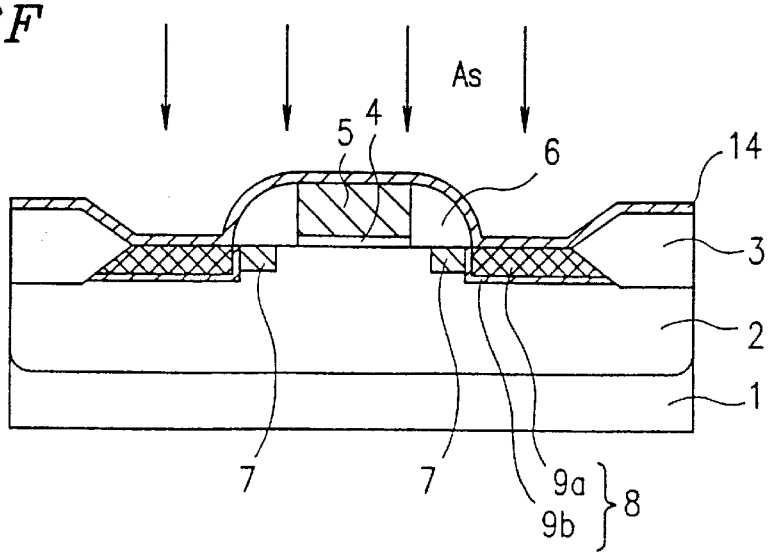
Figure 6G:
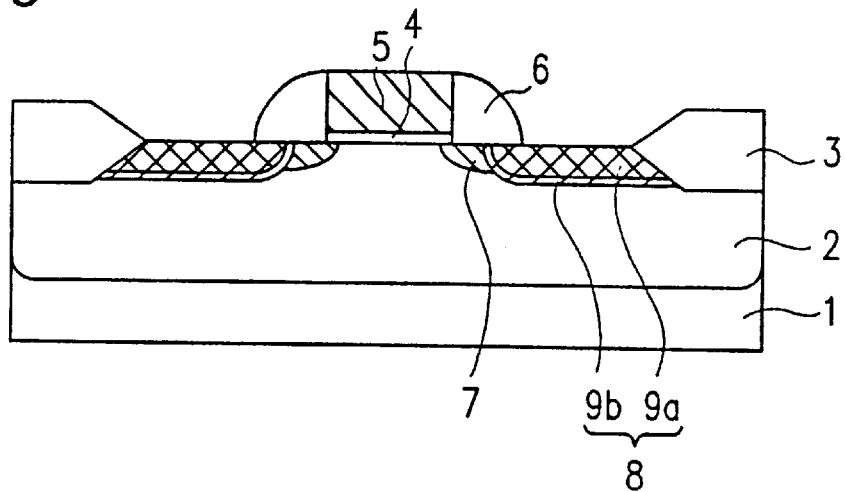
Figure 6H:
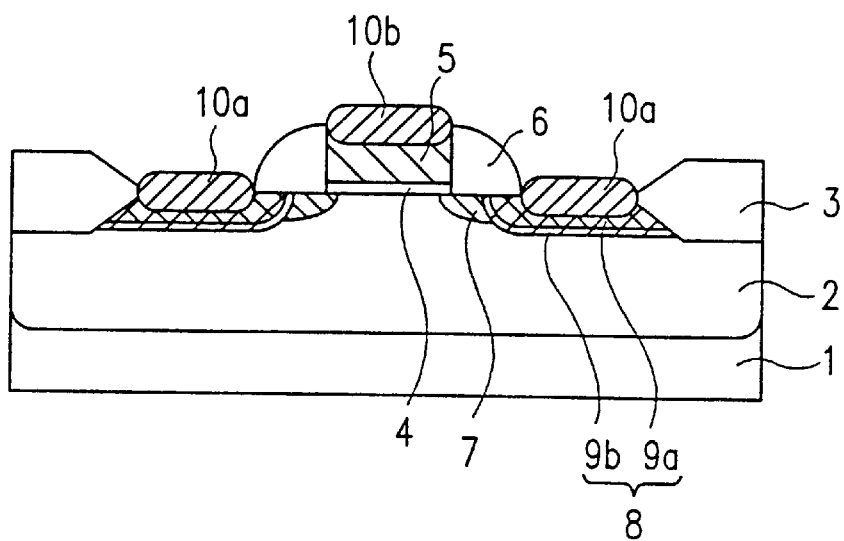

Then, as illustrated in FIG. 6F, the source-drain regions 8 are formed by ion implantation of $^{75}$As$^+$ as an impurity of the second conductive type. For example, $^{75}$As$^+$ may be implanted at about $1 \times 10^{14}$ cm$^{-2}$ at an energy of about 40 to 80 keV. As illustrated in FIG. 6F, the source-drain region 8 includes the high concentration region 9a. In the figure, reference numeral 9b denotes a portion of the source-drain region 8 excluding the high concentration region 9a.

The forming order of the high concentration region 9a and the source-drain region 8 is not limited to the above order, but it is also applicable to first form the source-drain region 8 by ion implantation of $^{75}$As$^+$ and then form the high concentration region 9a by ion implantation of $^{11}$B$^+$.

Then, an annealing process is performed in order to activate the LDD region 7 and the source-drain region 8 and to restore the crystal defects. In this step, an RTA (Rapid thermal annealing) process for 10 seconds at about 1000° C., or the like, may be performed. Then, the silicon nitride film 14 is removed by reverse sputtering (see FIG. 6G).

Next, titanium (Ti) as a high melting point metal is formed by deposition to be about 35 nm in thickness, which is thermally processed to form TiSi$_2$. Then, an unreacted portion of Ti on the gate electrode sidewall films 6 is removed by wet etching, and another thermal process is performed to further increase the stability. Thus, metal silicide portions 10a and 10b are formed in a self-alignment manner (see FIG. 6H). The metal silicide portions 10a, which are formed on the respective source-drain regions 8, are to be the source-drain electrodes 10a while the metal silicide portion 10b, which is formed on the polycrystalline silicon film 5, is to be the gate electrode 10b.

The n-channel insulated-gate field-effect transistor 100, as described in Example 1, can be produced through these steps. In the n-channel insulated-gate field-effect transistor 100, the implantation of the impurity (boron) of the first conductive type is performed in such a manner that the boron high concentration region 9a (or the boron concentration peak) is provided in the source-drain region 8 without considerably changing the impurity concentration in the substrate and channel regions in the vicinity of but excluding the source-drain region 8.

Due to such a boron concentration distribution in the source-drain region 8, during the annealing process, boron in the channel region does not diffuse in an accelerative manner into the source-drain region 8 since the boron in the high concentration region 9a of the source-drain region 8 fills the crystal defects. Thus, the B-depletion phenomenon can be suppressed. Therefore, it is possible to prevent the boron concentration in the vicinity of the n$^+$/p junction in the substrate region from being reduced by the B-depletion phenomenon and to suppress the short-channel effect. Moreover, since there exists no semiconductor region surrounding the source-drain region 8 with a high concentration of the impurity of the first conductive type (p-type), as in the prior art, the hot carrier resistance is not deteriorated. Furthermore, since the concentration distribution of the impurity of the first conductive type (i.e., the conductive type opposite to that of the source-drain region) has its peak in the source-drain region 8, there is little influence on the concentration of the impurity existing beneath the source-drain region. Thus, the reverse short-channel effect can be suppressed while the source-drain junction capacitance can be prevented from increasing.

EXAMPLE 4

In this example, a method for producing the n-channel insulated-gate field-effect transistor 200, as described in Example 2, will be described. The method for producing the n-channel insulated-gate field-effect transistor 200 according to Example 4 is partially the same as that according to Example 3, from the formation of the polycrystalline silicon film 5 to the deposition of the silicon nitride film 12 (i.e., the steps illustrated in FIGS. 6A and 6B).

Figure 7A:
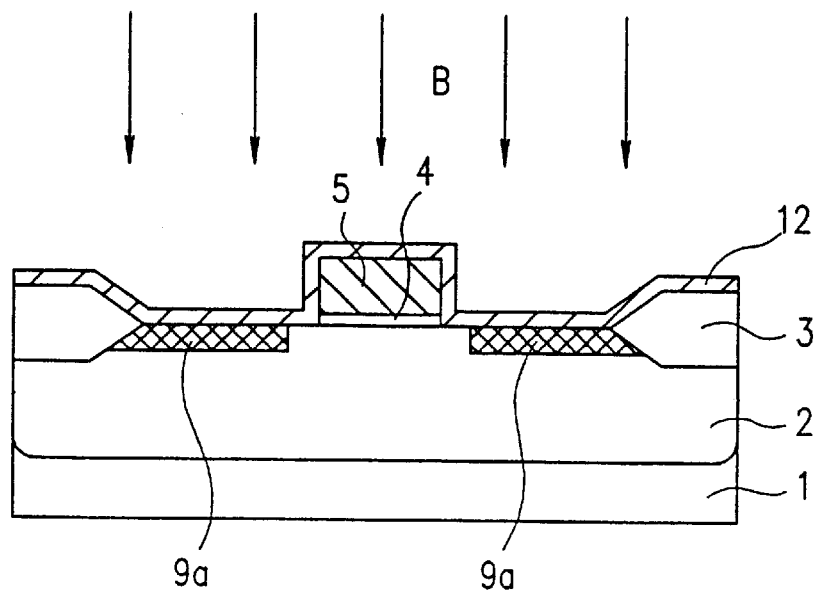
FIGS. 7A and 7B are cross-sectional views illustrating production steps for producing an insulated-gate field-effect transistor according to another example of the present invention.

Then, as illustrated in FIG. 7A, boron $^{11}$B$^+$ as an impurity of the first conductive type (p-type) is ion-implanted via the silicon nitride film 12 so as to form a boron high concentration region 9a (hereinafter, referred to as the "high concentration region 9a"). $^{11}B^+$ is implanted at, for example, about $3\times10^{12}$ to $5\times10^{13}$ cm$^{-2}$ at an energy of about 5 to 10 keV. Other than the boron ion $^{11}B^+$, a different impurity having the same conductive type (p-type) as that of $^{11}B^+$ may also be an impurity of the first conductive type (p-type) to be used for forming the high concentration region 9a. For example, $^{49}BF_2^+$ may be implanted at an energy of about 20 to 45 keV, or $^{115}In^+$ may be implanted at an energy of about 30 to 70 keV.

Moreover, it is necessary to properly set the conditions for the ion implantation for the high concentration region 9a so that the peak location of the impurity concentration (boron concentration) in the high concentration region 9a is in a region shallower than the source-drain region 8 (9b) to be formed in a subsequent step, and that the impurity concentration in the high concentration region 9a is greater than that in the substrate and channel regions excluding the source-drain region 8. Moreover, it is necessary to set the conditions for the ion implantation such that there will be little change in the impurity (boron) concentration in the channel region excluding the source-drain region 8.

Furthermore, the peak of the boron concentration distribution is in the vicinity of the nuclei of the crystal defects generated by the ion implantation for forming the LDD region 7'. Preferably, the boron concentration at the peak location is made as great as possible within a range such that it is equal to or less than the arsenic concentration in the LDD region 7' and that the charge-carrying electron concentration of the LDD region 7' and the impurity concentration of the channel and the substrate will not be changed considerably.

Figure 7B:
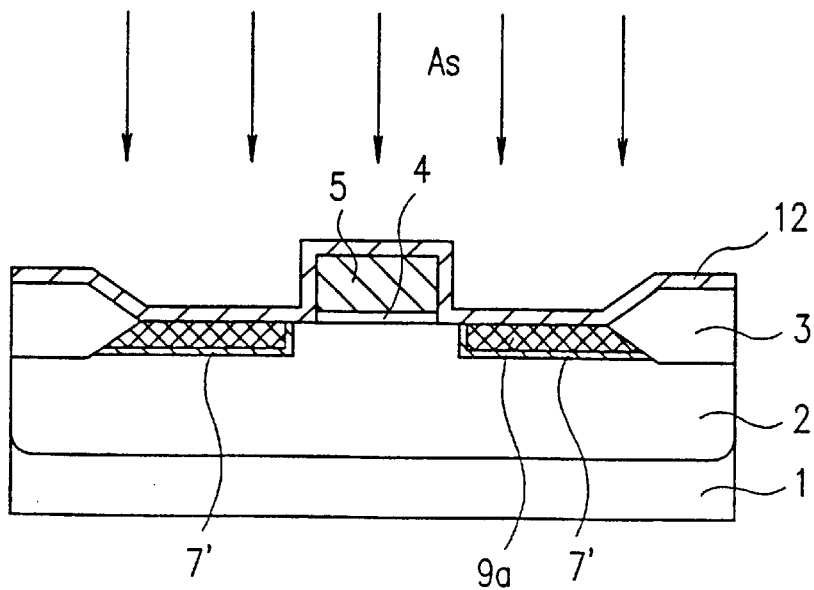

Then, as illustrated in FIG. 7B, the LDD region 7' is formed by ion implantation of $^{75}As^+$ as an impurity of the second conductive type. For example, $^{75}As^+$ may be implanted at about $1\times10^{14}$ to $5\times10^{14}$ cm$^{-2}$ at an energy of about 20 to 30 keV.

The forming order of the high concentration region 9a and the LDD region 7' is not limited to the above order, but it is also applicable to first form the LDD region 7' by ion implantation of $^{75}As^+$ and then form the boron high concentration region 9a by ion implantation of $^{11}B^+$. Herein, the arsenic concentration in the LDD region 7' is greater than the boron concentration in the boron high concentration region 9a.

Through these steps, the LDD region 7' is formed to include the high concentration region 9a.

Then, the formation of the source-drain region 8 and the subsequent steps are performed through the steps described in Example 3, thereby producing the insulated-gate field-effect transistor 200 as described in Example 2.

As described above, in the insulated-gate field-effect transistor 200 according to the present example, the impurity implantation is performed in such a manner that the boron concentration has its peak in the LDD region 7' without considerably changing the impurity concentration in the substrate and channel regions excluding the LDD region 7'.

Due to such a boron concentration distribution in the LDD region 7', during the annealing process, the impurity in the channel region does not diffuse in an accelerative manner into the LDD region 7' and the source-drain region 8 since the boron in the LDD region 7' fills the crystal defects. Thus, the B-depletion phenomenon can be suppressed. Therefore, it is possible to prevent the boron concentration in the vicinity of the n$^+$/p junction in the substrate region from being reduced by the B-depletion phenomenon and to suppress the short-channel effect. Moreover, since there exists no semiconductor region surrounding the LDD region 7' with a high concentration of the impurity of the first conductive type (p-type), as in the prior art, the hot carrier resistance is not deteriorated. Furthermore, since the concentration distribution of the impurity of the first conductive type (i.e., the conductive type opposite to that of the source-drain region) has its peak in the LDD region 7', there is little influence on the concentration of the impurity existing beneath the source-drain region. Thus, the reverse short-channel effect can be suppressed while the source-drain junction capacitance can be prevented from increasing.

Generally, the LDD region needs to be formed near the silicon substrate surface, i.e., it needs to be formed to be shallow. When crystal defects are generated due to the implantation of the n-type impurity $^{75}As^+$ for forming the LDD region, boron is likely to be drawn to and segregated in the crystal defects during an annealing process. Thus, the crystal defects resulting from the LDD region formation process have a great influence particularly on the boron concentration of the channel region and the substrate. Accordingly, by providing the high concentration region of boron (or a different impurity having the same conductive type as that of boron) in the LDD region of the insulated-gate field-effect transistor 200 of the present example, a greater effect can be realized. In the present example, it is also possible to eliminate the boron implantation into the source-drain region 8 by controlling the ion implantation conditions so that the short-channel effect can be suppressed only by the ion implantation of boron into the LDD region 7'.

EXAMPLE 5

In this example, another method for producing the n-channel insulated-gate field-effect transistor 200, as described in Example 2, will be described. The method for producing the n-channel insulated-gate field-effect transistor 200 according to Example 5 is partially the same as that according to Example 3, from the formation of the polycrystalline silicon film 5 and the deposition of the silicon nitride film 12 to the formation of the LDD region 7' (i.e., the steps illustrated in FIGS. 6A to 6C).

Figure 8A:
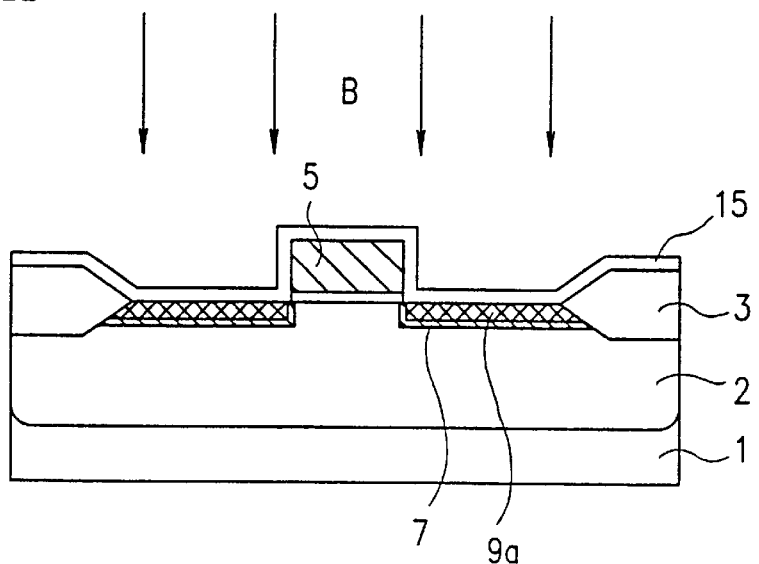
FIGS. 8A to 8C are cross-sectional views illustrating production steps for producing an insulated-gate field-effect transistor according to another example of the present invention.

Then, as illustrated in FIG. 8A, an oxide film 15 is formed by deposition so as to be about 50 to 100 nm in thickness and to entirely cover the surface of the substrate Then, $^{11}B^+$ is ion-implanted via the oxide film 15 so as to form a boron high concentration region 9a (hereinafter, referred to as the "high concentration region 9a"). $^{11}B^+$ is implanted at, for example, about $1\times10^{12}$ to $1\times10^{13}$ cm$^{-2}$ at an energy of about 10 to 30 keV.

Other than the boron ion $^{11}B^+$, a different impurity having the same conductive type (p-type) as that of $^{11}B^+$ may also be an impurity of the first conductive type (p-type) to be used for forming the high concentration region 9a. For example, $^{49}BF_2^+$ may be implanted at an energy of about 40 to 130 keV, or $^{115}In^+$ may be implanted at an energy of about 100 to 240 keV.

Moreover, it is necessary to properly set the conditions for the ion implantation for the high concentration region 9a so that the peak location of the impurity concentration (boron concentration) in the high concentration region 9a is in a region shallower than the source-drain region 8 (9b) to be formed in a subsequent step, and that the impurity concentration in the high concentration region 9a is greater than that in the substrate and channel regions excluding the source-drain region 8. Moreover, it is necessary to set the conditions for the ion implantation such that there will be little change in the impurity (boron) concentration in the channel region excluding the source-drain region 8.

Furthermore, the peak of the boron concentration distribution is in the vicinity of the nuclei of the crystal defects generated by the ion implantation for forming the LDD region 7'. Preferably, the boron concentration at the peak location is made as great as possible within a range such that it is equal to or less than the arsenic concentration in the LDD region 7' and that the charge-carrying electron concentration of the LDD region 7' and the impurity concentration of the channel and the substrate will not be changed considerably.

As described above, by ion-implanting $^{11}B^+$ via the relatively thick insulating film 15, it becomes easy to control the conditions for the impurity implantation.

Figure 8B:
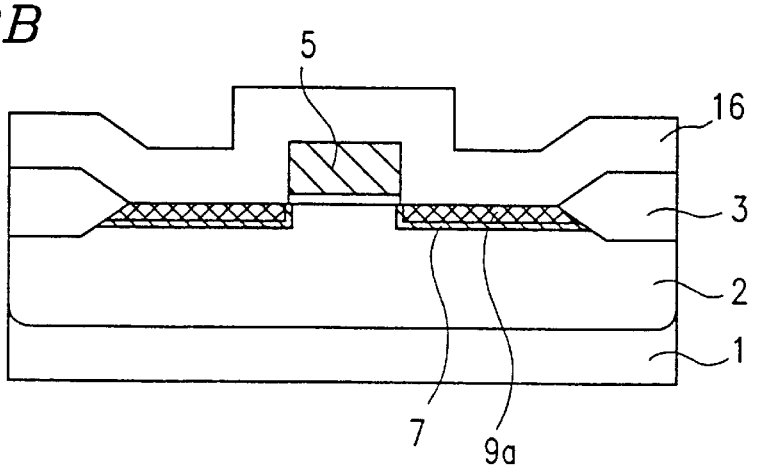

Then, as illustrated in FIG. 8B, an oxide film 16 is formed by deposition to be about 100 to 200 nm in thickness.

Figure 8C:
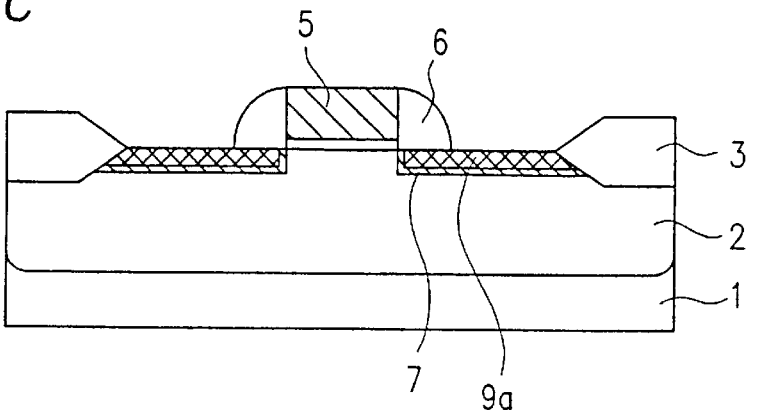
Figure 9A:
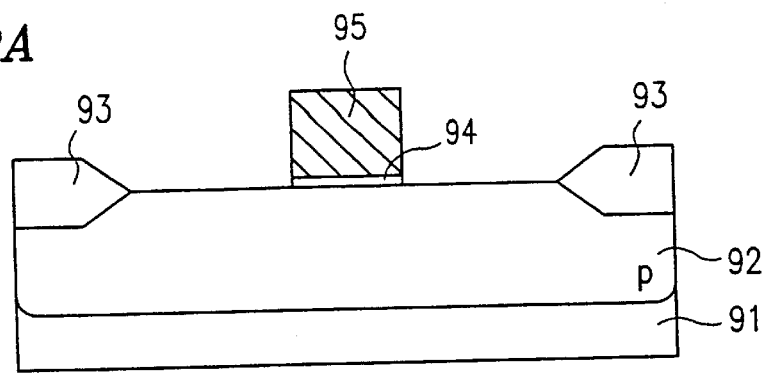
FIGS. 9A to 9H are cross-sectional views illustrating production steps for producing a conventional insulated-gate field-effect transistor.
Figure 9B:
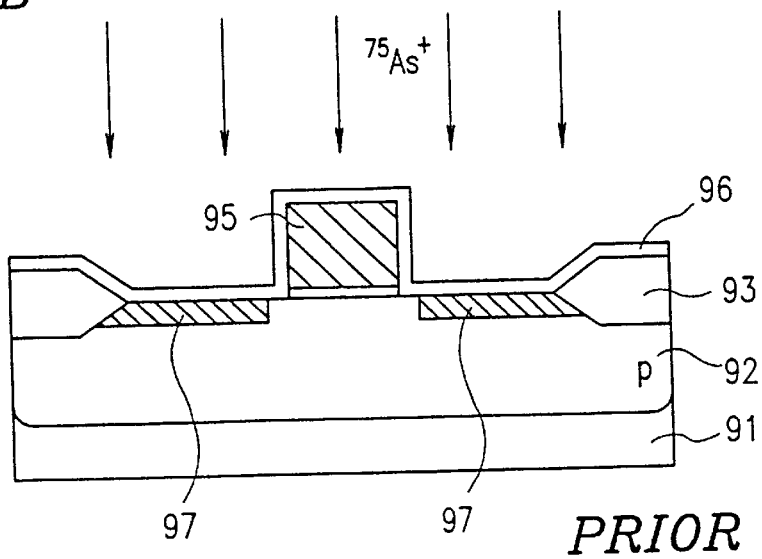
Figure 9C:
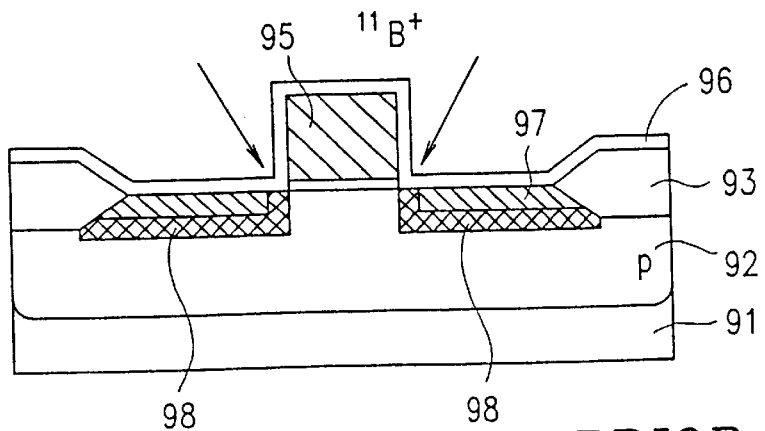
Figure 9D:
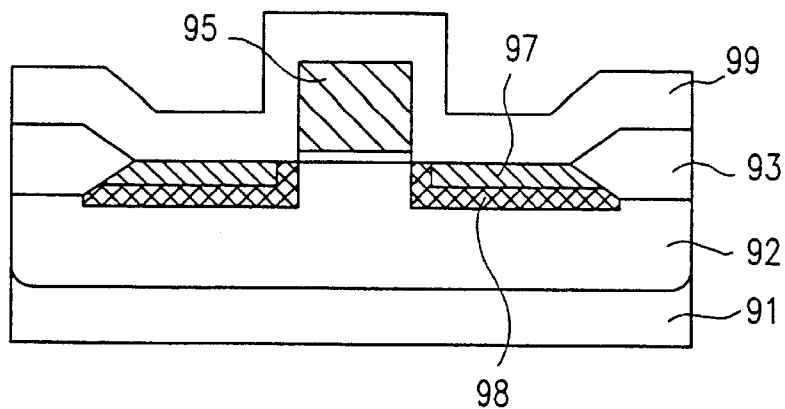
Figure 9E:
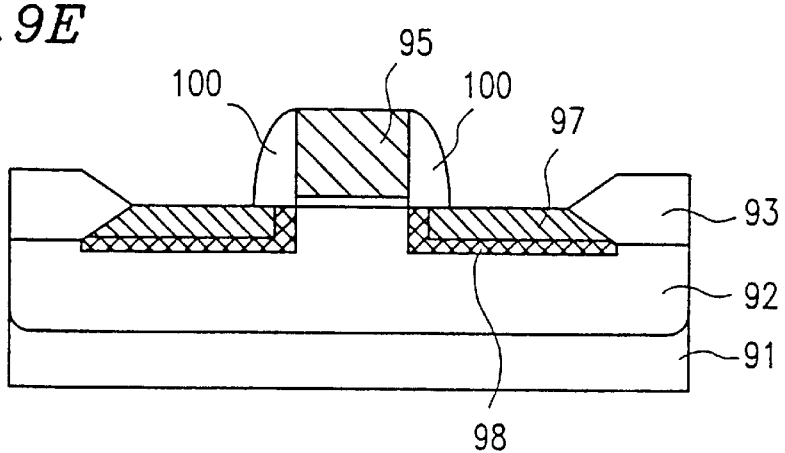
Figure 9F:
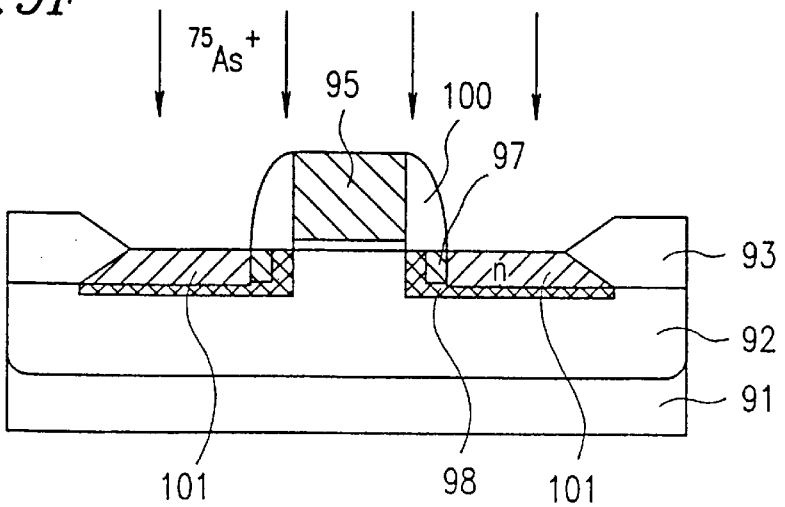
Figure 9G:
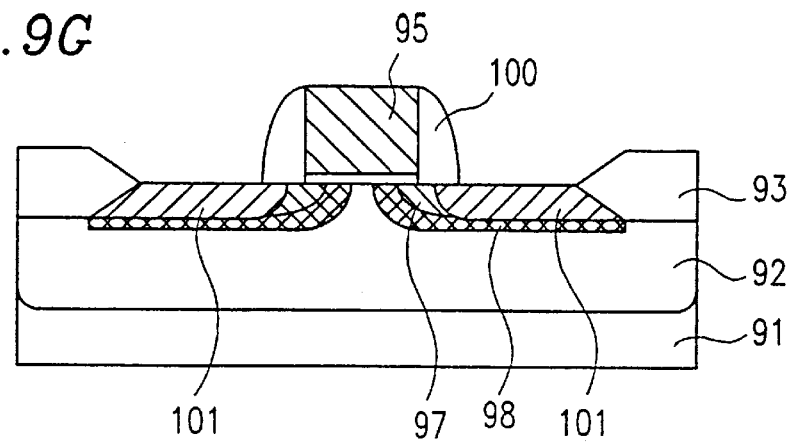
Figure 9H:
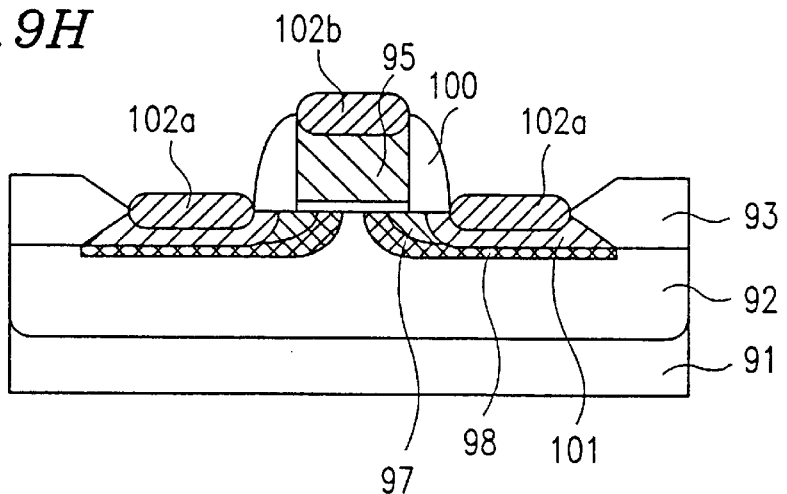

Subsequently, as illustrated in FIG. 8C, the gate electrode sidewall film 6 is formed by anisotropically etching the oxide film 16.

The subsequent steps are the same as those described in Example 3. Through the formation of the source-drain region 8 and the subsequent steps, the insulated-gate field-effect transistor 200, as described in Example 2, can be produced.

Moreover, as described in Example 4, it is also possible to eliminate the boron implantation into the source-drain region 8 by controlling the ion implantation conditions so that the short-channel effect can be suppressed only by the ion implantation of boron into the LDD region 7'.

As described above, in the insulated-gate field-effect transistor 200 of the present example, the impurity implantation is performed in such a manner that the boron concentration has its peak in the LDD region 7' without considerably changing the impurity concentration in the substrate and channel regions excluding the LDD region 7'.

Due to such a boron concentration distribution in the LDD region 7', during the annealing process, the impurity in the channel region does not diffuse in an accelerative manner into the LDD region 7' and the source-drain region 8 since the boron in the LDD region 7' fills the crystal defects. Thus, the B-depletion phenomenon can be suppressed. Therefore, it is possible to prevent the boron concentration in the vicinity of the $n^+/p$ junction in the substrate region from being reduced by the B-depletion phenomenon and to suppress the short-channel effect. Moreover, since there exists no semiconductor region surrounding the LDD region 7' with a high concentration of the impurity of the first conductive type (p-type), as in the prior art, the hot carrier resistance is not deteriorated. Furthermore, since the concentration distribution of the impurity (boron) of the first conductive type (i.e., the conductive type opposite to that of the source-drain region) has its peak in the LDD region 7', there is little influence on the concentration of the impurity existing beneath the source-drain region. Thus, the reverse short-channel effect can be suppressed while the source-drain junction capacitance can be prevented from increasing.

In the insulated-gate field-effect transistor of the present invention, it is possible to prevent the impurity concentration in the substrate and channel regions in the vicinity of but excluding the source-drain region from being reduced (by segregation of an impurity having the conductive type opposite to that of the source-drain region in the crystal defects generated by the ion implantation for forming the source-drain region) without increasing the implantation concentration of impurity into the substrate and channel regions in the vicinity of but excluding the source-drain region. Thus, it is possible to suppress the short-channel effect while suppressing the hot carrier, the reverse short-channel effect and the increase of junction capacitance.

Moreover, the short-channel effect can be further suppressed by providing, in the LDD region, an impurity having the conductive type opposite to that of the LDD region. Thus, an insulated-gate field-effect transistor having an even better performance can be provided.

Furthermore, since the concentration distribution of the impurity of the conductive type opposite to that of the source-drain region has its peak in the source-drain region, there will be little change in the concentration of the impurity existing beneath the channel region and the source-drain region. As a result, the source-drain junction capacitance is not increased as in the prior art.

Furthermore, although boron is commonly used as an impurity having the conductive type opposite to that of the source-drain region and the LDD region, when indium is used instead of boron, it becomes easy to control the diffusion and the concentration distribution of the impurity.

Furthermore, according to the method for producing the insulated-gate field-effect transistor of the present invention, it is possible to widen the range of possible impurity implantation energy by implanting such an impurity having the conductive type opposite to that of the source-drain region and the LDD region after depositing a relatively thick insulating film. Thus, it is possible to suppress the short-channel effect while also suppressing the hot carrier, the reverse short-channel effect and the junction capacitance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An insulated-gate field-effect transistor formed in a substrate of a first conductive type or in a well of the first conductive type formed in the substrate, the transistor comprising:

a channel region containing an impurity of the first conductive type; and a source-drain region containing an impurity of a second conductive type, wherein:

the source-drain region further contains an impurity of the first conductive type; and a concentration of the impurity of the first conductive type contained in the source-drain region is greater than a concentration of the impurity of the first conductive type contained in the channel region but is less than a concentration of the impurity of the second conductive type contained in the source-drain region.

2. An insulated-gate field-effect transistor according to claim 1, wherein a concentration peak of the impurity of the first conductive type exists in the source-drain region.

3. An insulated-gate field-effect transistor according to claim 2, wherein a location of the concentration peak of the impurity of the first conductive type is in a vicinity of a location of a concentration peak of the impurity of the second conductive type in the source-drain region.

4. An insulated-gate field-effect transistor according to claim 1, wherein:

the insulated-gate field-effect transistor is an nMOS transistor; and the impurity of the first conductive type in the source-drain region is boron.

5. An insulated-gate field-effect transistor according to claim 1, wherein:

the insulated-gate field-effect transistor is an nMOS transistor; and the impurity of the first conductive type in the source-drain region is indium.

6. An insulated-gate field-effect transistor formed in a substrate of a first conductive type or in a well of the first conductive type formed in the substrate, the transistor comprising:

a channel region containing an impurity of the first conductive type;

a source-drain region containing an impurity of a second conductive type; and an LDD region formed between the channel region and the source-drain region so as to adjoin the channel region and the source-drain region, the LDD region containing an impurity of the second conductive type whose concentration is less than a concentration of the impurity of the second conductive type contained in the source-drain region, wherein:

the LDD region further contains an impurity of the first conductive type; and a concentration of the impurity of the first conductive type contained in the LDD region is greater than a concentration of the impurity of the first conductive type contained in the channel region but is less than a concentration of the impurity of the second conductive type contained in the LDD region.

7. An insulated-gate field-effect transistor according to claim 6, wherein a concentration peak of the impurity of the first conductive type exists in the LDD region.

8. An insulated-gate field-effect transistor according to claim 7, wherein a location of the concentration peak of the impurity of the first conductive type is in a vicinity of a location of a concentration peak of the impurity of the second conductive type in the LDD region.

9. An insulated-gate field-effect transistor according to claim 6, wherein:

the insulated-gate field-effect transistor is an nMOS transistor; and the impurity of the first conductive type in the LDD region is boron.

10. An insulated-gate field-effect transistor according to claim 6, wherein:

the insulated-gate field-effect transistor is an nMOS transistor; and the impurity of the first conductive type in the LDD region is indium.

* * * * *